(12) United States Patent
Harter et al.

(10) Patent No.: US 7,461,311 B2
(45) Date of Patent: Dec. 2, 2008

(54) DEVICE AND METHOD FOR CREATING A SIGNATURE

(75) Inventors: Werner Harter, Illingen (DE); Ralf Angerbauer, Schwieberdinger (DE); Eberhard Boehl, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 188 days.

(21) Appl. No.: 10/539,495

(22) PCT Filed: Dec. 18, 2003

(86) PCT No.: PCT/DE03/04177

§ 371 (c)(1),
(2), (4) Date: Dec. 12, 2005

(87) PCT Pub. No.: WO2004/057356

PCT Pub. Date: Jul. 8, 2004

(65) Prior Publication Data

US 2006/0179393 A1    Aug. 10, 2006

(30) Foreign Application Priority Data

Dec. 20, 2002 (DE) ............................ 102 61 250
Nov. 4, 2003 (DE) ............................ 103 51 442

(51) Int. Cl.
*G01R 31/28* (2006.01)

(52) U.S. Cl. .................. 714/732; 714/724; 714/727; 714/728; 714/734; 714/741

(58) Field of Classification Search ............. None
See application file for complete search history.

(56) References Cited

U.S. PATENT DOCUMENTS

| | | | | |
|---|---|---|---|---|
| 4,688,223 A | * | 8/1987 | Motika et al. | 714/728 |
| 4,745,355 A | * | 5/1988 | Eichelberger et al. | 714/728 |
| 5,784,383 A | * | 7/1998 | Meaney | 714/732 |
| 6,055,660 A | * | 4/2000 | Meaney | 714/732 |
| 6,199,184 B1 | * | 3/2001 | Sim | 714/732 |
| 6,249,892 B1 | * | 6/2001 | Rajsuman et al. | 714/741 |
| 6,249,893 B1 | * | 6/2001 | Rajsuman et al. | 714/741 |

OTHER PUBLICATIONS

Biswas, "Design of UED-AUED Codes from Berger's AUED Code", IEEE VLSI Design, 1997, Jan. 1997, pp. 364-369.*

Built-In Test for VLSI: Pseudorandom Techniques by Paul H. Bardell, William H. McAnney and Jacob Savir; pp. 124 et seq.

(Continued)

*Primary Examiner*—John P Trimmings
(74) *Attorney, Agent, or Firm*—Kenyon & Kenyon LLP

(57) ABSTRACT

A device and a method for forming a signature, a predefined number of shift registers being provided, to which input data to be tested is applied bit-by-bit and in parallel as successive data words and which serially shift the input data forward in a predefinable cycle, a signature being formed in the shift registers after a certain number of data words and cycles, a code generator which generates at least one additional bit position in at least one additional shift register from each data word in the signature also being provided.

10 Claims, 3 Drawing Sheets

OTHER PUBLICATIONS

A Linear Code-Preserving Signature Analyzer COPMISR; Hlawiczka et al; VLSI Test Symposium, 1997-15th IEEE Monterey, CA USA Apr. 27-May 1, 1997.; pp. 350-355.

Low Cost BIST for EDAC Circuits; Badura et al; Test Symposium, 1997 (ATS '97), Proceedings, Sixth Asian Akita, Japan Nov. 17-19, 1997; pp. 410-415.

Utilization of On-Line (Concurrent) Checkers During Built-In-Self-Test and Vice Versa; Gupta et al.; IEEE Transactions on Computers; Jan. 1, 1996; pp. 63-73.

Design of t-UED/AUED Codes from Berger's AUED Code; Biswas et al.; VLSI Design, 1997, Proceedings, Tenth International Conference on Hyderabad; Jan. 4-7, 1997; pp. 364-369.

* cited by examiner

DEVICE AND METHOD FOR CREATING A SIGNATURE

BACKGROUND INFORMATION

MISR (Multiple Input Signature Register) circuits, such as described in the publication "Built-In Test for VLSI: Pseudo-random Techniques" by Paul H. Bardell, William H. McAnney, and Jacob Savir, pp. 124 et seq., are used for forming signatures. In circuits of this type, a given number of shift registers is provided to which data to be tested is applied in a sequence. The data occurring simultaneously is injected and shifted forward by the shift registers in a predefined cycle. After a precisely defined number of data words and cycles, there is a signature value in the shift registers which is testable and comparable with a previously known signature value. To test a sequence, and thus the data applied, for errors, it is sufficient to compare the signature value obtained with the expected signature value. The previously known signature values may also be determined in this way.

Problems occur with the method and the device of the related art when at a point in time T there is an error at a certain input, because an incorrect value is then written initially into the shift register affected. The computed end signature will therefore differ from the expected signature. However, if an additional error occurs at a subsequent point in time T+1 at a subsequent, in particular directly subsequent, input, the original error at the first input is compensated again, after being shifted by the shift registers, using a number of cycles which corresponds to the distance between the inputs and points in time, using one cycle in particular, if there is no feedback junction of the MISR, i.e., the signature generator circuit, in between. Errors occurring at such problem points in time and data word positions are thus not detected in forming the signature.

One option for taking precautions during the input to avoid this problem is to supply the inverse data word following a data word, so that an error is not compensated but detected in each case. However, this procedure doubles the number of required operations and cycles.

It is thus evident that the related art was unable to provide results that are optimum from every point of view, making the object necessary to develop an improved device and an improved method for mastering the above-named problems when forming signatures.

SUMMARY OF THE INVENTION

The present invention is directed to a device and a method for forming a signature, a predefined number of shift registers (shift register with a predefined number of bit positions, represented by flip-flops) being provided, to which input data to be tested is applied bit-by-bit and in parallel as successive data words and which serially shift the input data forward in a predefinable cycle, and a signature is formed in the shift registers after a certain number of data words and cycles, a code generator which generates at least one additional bit position in at least one additional shift register from each data word in the signature also being advantageously provided. This means that the MISR is advantageously extended by at least one bit position; this bit position is obtained from the complete data word applied at the time and is also included in the signature. This makes it advantageously possible to master the above-mentioned problem without performing a plurality of additional operations and cycles when forming the signature.

Error masking in the event of the above-mentioned multiple errors is thus prevented using minimum additional circuit complexity.

It is furthermore advantageous that the individual shift registers are connected by antivalence points, i.e., XOR gates, and the individual bit positions are also inserted via these antivalence points.

It is also conceivable to use an equivalence point, i.e., a negated XOR instead of an antivalence gate, i.e., an antivalence point to insert the individual bit positions of the data words and the at least one bit position of the code generator into the corresponding shift registers.

The code generator is advantageously designed in such a way that it implements an ECC (Error Check and Correction) code such as, for example, a Hamming code, a Berger code, or a Bose-Lin code, etc., to input the number of bit positions corresponding to the particular ECC code into a corresponding number of additional shift registers to form the signature. In the most generic case, a code generator table (hard-wired or in software form) may be used to assign a desired code pattern of any desired length to a given input pattern of data words or bits. In the simplest case, the code generator is advantageously designed in such a way that it forms a parity bit and inputs it into an additional (bit position of the) shift register (represented by a flip-flop or another memory element).

DETAILED DESCRIPTION

Figure 1:
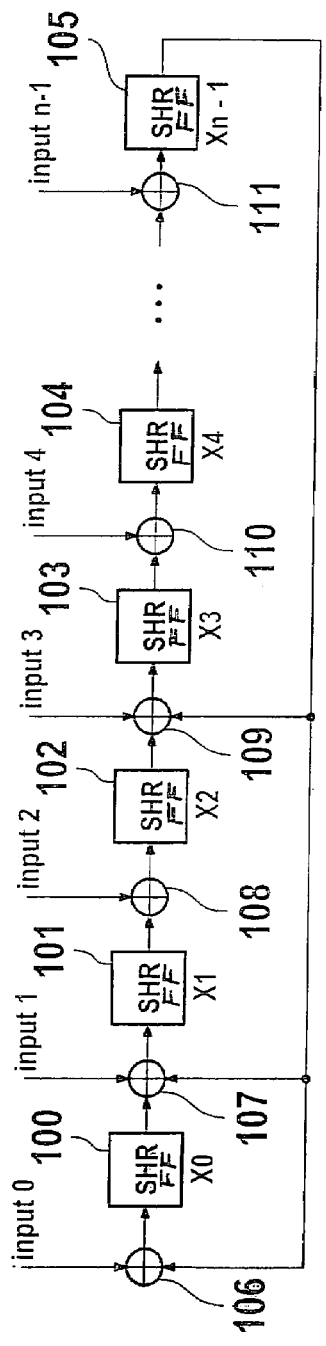
FIGS. 1-4 illustrate the device and method according to the present invention.

FIG. 1 shows an MISR circuit having shift registers 100 through 105 and antivalence, i.e., XOR, gate points 106 through 111. A modular type corresponding to the feedback is illustrated here. Input 0, input 1, input 2, input 3, input 4, and input n−1, which correspond to the respective bit positions of the data words applied are inserted into the shift registers and input and shifted through in a predefined cycle. In the shift registers this then results in states X0, X1, X2, X3, X4, and Xn−1, where n is a natural number greater than zero, in this concrete example at least 6.

Figure 2:
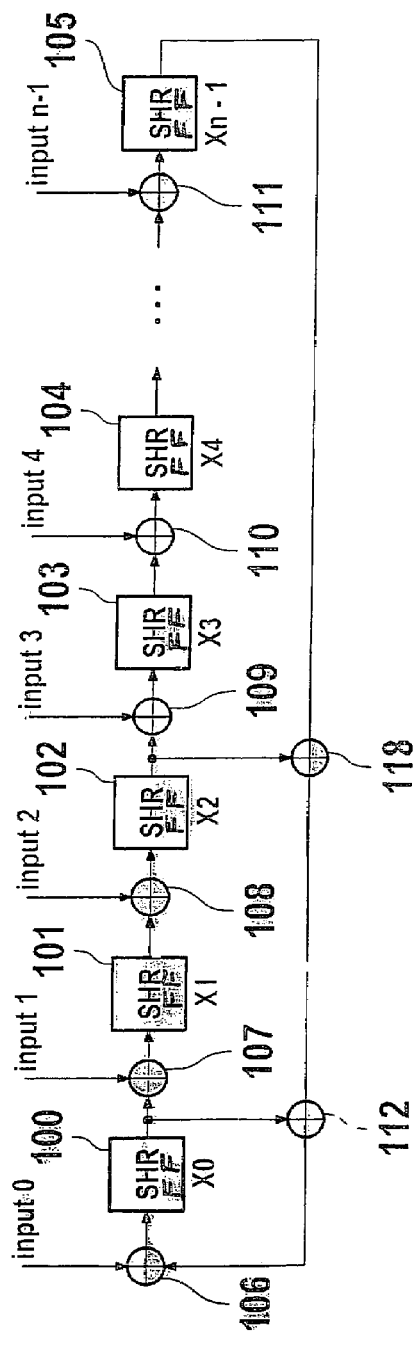

FIG. 2 also shows an MISR circuit having shift registers 100 through 105 and antivalence, i.e., XOR, gates 106 through 111. Furthermore, two additional XOR gates 111 and 113 are shown which in this example are located downstream from shift register 100 and shift register 102. This is therefore a standard type of an MISR; the insertion points, i.e., antivalence gates 112 and 113, as well as their number, may be freely selected in the MISR. Also in this case, inputs 0 through n−1 are shown, as well as the states of shift registers X0 through Xn−1 where n∈N.

Figure 3:
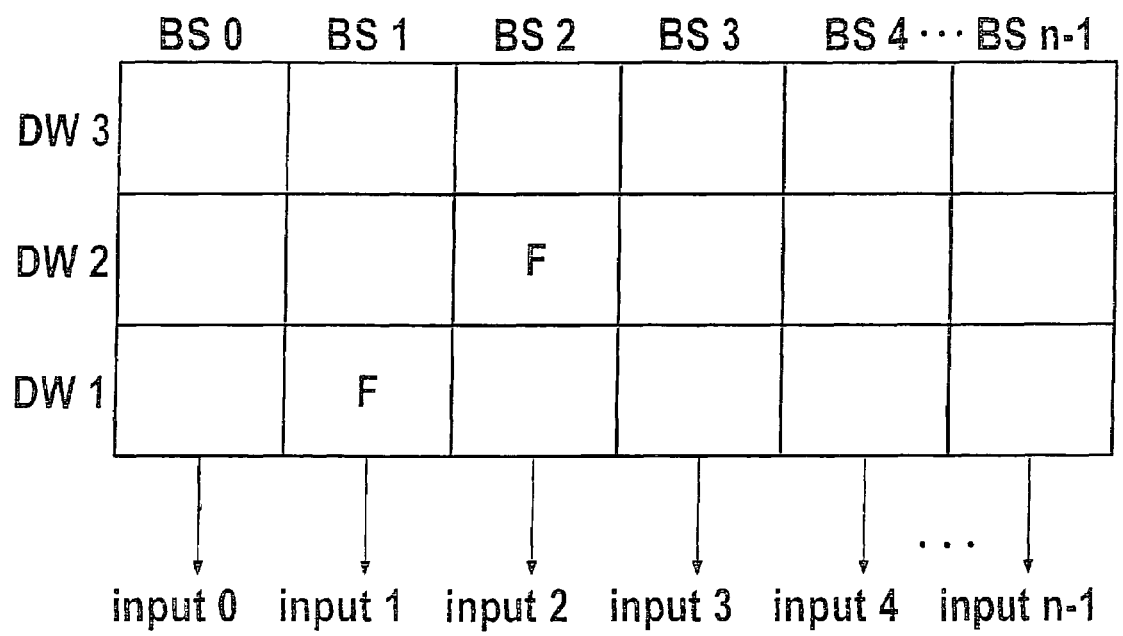

FIG. 3 shows three data words DW1, DW2, and DW3, which are to be applied to inputs 0 through n−1 in this order. The individual bit positions are labeled BS0 through BSn−1. If there is an error F in data word DW1, for example, intended for input 1 at point in time T and also in data word DW2, i.e., at input 2 at a later point in time T+1, these errors are compensated after shifting by one cycle in the MISR. The same applies to other error configurations resulting in compensation due to their time of insertion or position in the data word and the corresponding input.

Figure 4:
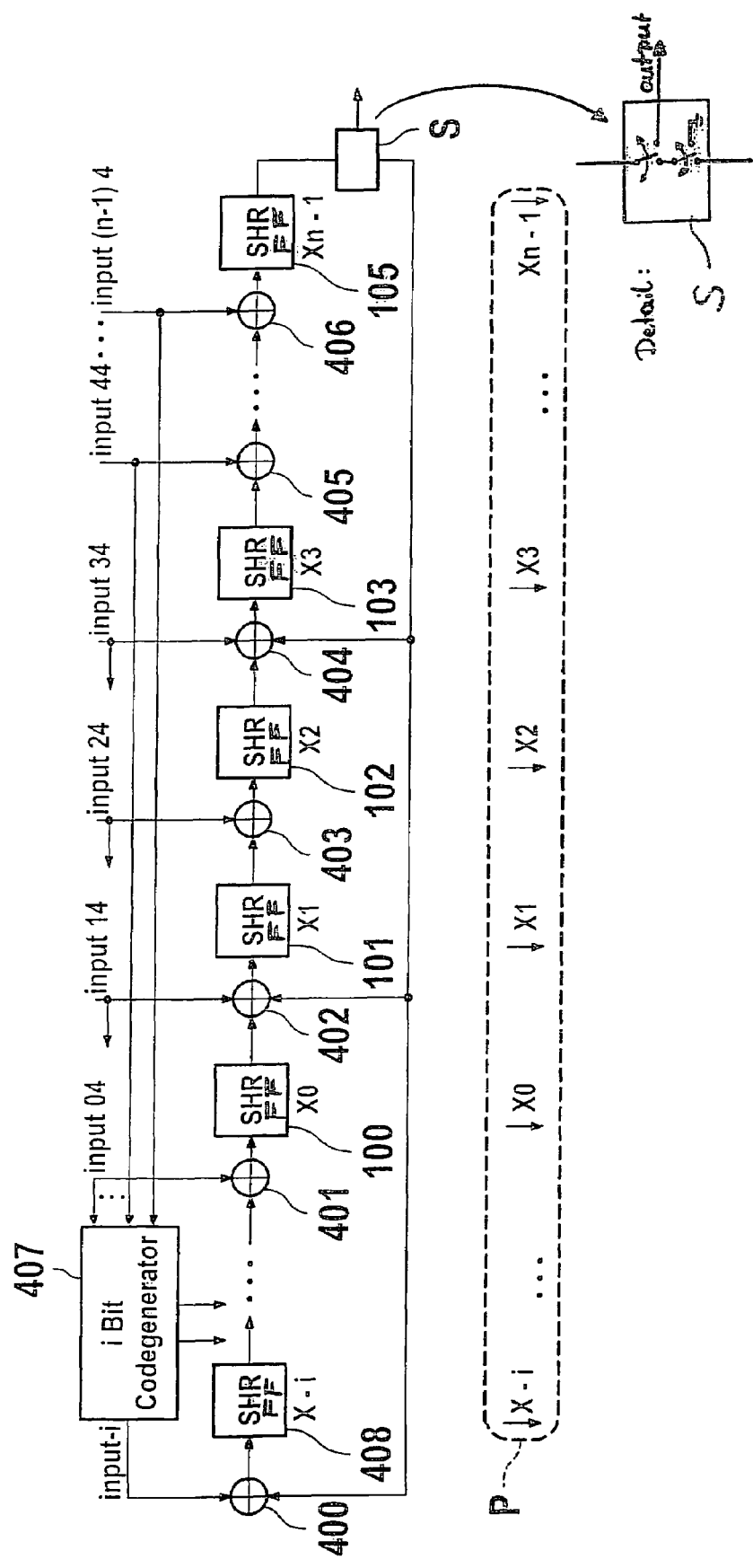

In FIG. 4, the MISR is now extended by an i bit code generator 407. Here i, also as a natural number greater than zero, stands for the number of bits inserted into the MISR by the code generator according to the code used or the ECC code in the code generator. A number of shift registers (flip-flops), labeled 408 here, corresponding to this number i of the bit positions output by the code generator, is also provided in addition to the MISR. In the simplest case, a parity bit is formed here, so that only one additional shift register and one additional input −1 is then provided.

The position in the MISR where the at least one additional shift register or the at least one additional insertion point, i.e., antivalence or equivalence point, is inserted is freely selectable and is shown here as an example only. This means that here also in FIG. 4 the usual shift registers 100 through 105 are shown, at least one additional shift register 408 being provided. The inputs of the device according to the present invention, input 04, input 14, input 24, input 34, input 44, and input (n−1)4, are connected here not only to the antivalence points, i.e., the XOR gates, but also to the i bit code generator. Thus, in the predefined cycle, additional information, dependent on the code used (ECC in particular), is generated from each incoming data word and input into an appropriate number of shift registers. In this example, elements 400 through 406 are provided as XOR gates, in our example the usual states X0, X1, X2, X3, and Xn−1 of the shift registers resulting in addition to input −i and state X-i of shift register 408. The additional arrows as the output of i bit code generator 407 indicate that in another embodiment even more than just one additional bit position are written into the MISR, depending on the code used.

Thus, for example, if a Hamming code is used with ECC for single-error correction and 4 bits of useful data, a 3-bit correction code results. For ECC single-error correction and 8 bits of useful data, 4-bit correction codes result. For 16 bits of useful data, 5-bit correction codes, and for 32 bits of useful data 6-bit correction codes result. This means that, in general, $2^k >= m+k+1$, where m is equivalent to the number of useful bits as a natural number greater than zero, and k is equivalent to the number of code bits or correction bits, i.e., the correction code also as a natural number. If double-error detection is also to be performed, one additional bit is to be provided for the correction code.

For example, if a Berger code is used, 3 code bits and 5 states are to be provided for 4 bits of useful data; for 8 bits of useful data and 9 states, 4 additional code bits are to be provided. For 16 bits of useful data, 5 additional code bits for 17 states, and for 32 bits of useful data 6 additional code bits for 33 states are to be provided. Here, in general, $2^k >= m+1$ or $k >= ld(m+1)$, where m is the number of useful bits of the data and k is the number of code bits, i.e., the correction code.

Further codes such as the Bose-Lin code may also be used, in which case the number of coding bits is the same as in the Berger code, but the check bits used are either only modulo 4 or modulo 8.

The number of code generator outputs, i.e., additional inputs −i where i=1 through k∈N, and the number of shift registers and gates provided also corresponds to the number of these coding bits k.

The MISR is thus extended by at least one position by obtaining at least one parity or other code from the original data input 0 through input n−1, and is also included in the signature, shown in this example of FIG. 4 for the modular type (FIG. 1). Of course, the same applies to the standard type (FIG. 2). The code generator may thus be a parity generator where i=1, in this case one additional flip-flop being required. In the event where an error occurs, for example, at input 3, a modified value is additionally supplied at input −1, i.e., the parity input. To mask this value in the event of an error, an error is required both at input 4 and at input 0 specifically in the next cycle. This means that there is a higher Hamming distance here and the likelihood of masking is considerably reduced due to the required precise timing in the event of error masking via double error.

The Hamming distance may be further increased as desired using more code bits as mentioned above. If, instead of antivalence, an equivalence gate is used for insertion, still a considerably lower error masking probability, although a slightly lower redundancy, is achieved than in the related art.

As another option, code generator 407 may also use assignment by table, i.e., a code generator table causes a predefined number of code bits to be inserted into a corresponding number of shift registers as a function of the incoming bit combination of the data word. Any desired assignment of incoming data bits to output coding bits is possible by using such a code generator table.

In the serial alternative, a switching means S which interrupts the feedback line and allows the registers to be serially read is provided for reading the signature formed from the MISR. Another option is, as indicated by the letter P and the dashed line, to output the shift registers in parallel and thus to output the signature from the MISR all at once to compare it with a corresponding expected signature.

This means that the present invention represents a considerably higher safety factor than a conventional MISR, while using less resources than a constantly required inversion of the data words for compensating an error masking.

Therefore, the present invention is usable in all applications critical with regard to safety, in particular in the automobile industry such as in brake controls (ABS, ASR, ESP, etc.), steer-by-wire, brake-by-wire, i.e., in general x-by-wire, airbag, engine control, transmission control, etc. The present invention may also be used in microcontrollers or other semiconductor structures in testing, as well as in all BIST (built-in self-test) structures and for optimizing production testing.

What is claimed is:

1. A device for forming a signature, comprising:
a shift register having a predefined number of bit position memory devices, to which input data to be tested is applied bit-by-bit and in parallel as successive data words and which serially shift the input data forward in a predefined cycle, a signature being formed in the bit position memory devices after a predefined number of applied data words and cycles; and
a code generator which generates at least one additional bit position in at least one additional bit position memory device of the shift register from each applied data word in the signature.

2. The device according to claim 1, wherein the individual bit position memory devices are connected by antivalence points, and the individual bits of the data words at the antivalence points, as well as the at least one additional bit position of the code generator, are inserted to form the signature.

3. The device according to claim 1, wherein the individual bit position memory devices are connected by equivalence points, and the individual bits of the data words, as well as the at least one additional bit position of the code generator, are inserted at the equivalence points to form the signature.

4. The device according to claim 1, wherein the code generator implements an ECC code and inputs a number of bit positions corresponding to the ECC code being used into a corresponding number of additional bit position memory devices to form the signature.

5. The device according to claim 4, wherein the code generator implements a Hamming code.

6. The device according to claim 4, wherein the code generator implements a Berger code.

7. The device according to claim 4, wherein the code generator implements a Bose-Lin code.

8. The device according to claim 4, wherein the code generator implements a generic code generator table.

9. The device according to claim 1, wherein the code generator forms a parity bit and inputs it in an additional bit position memory device of the shift register.

10. A method for forming a signature, comprising:

providing a shift register having a predefined number of bit position memory devices, to which input data to be tested is applied bit-by-bit and in parallel as successive data words and which serially shift the input data forward in a predefined cycle, a signature being formed in the bit position memory devices after a predefined number of applied data words and cycles; and providing a code generator which generates at least one additional bit position in at least one additional bit position memory device of the shift register from each applied data word in the signature.

* * * * *